(12) United States Patent
Xiong et al.

(10) Patent No.: US 7,796,048 B2
(45) Date of Patent: Sep. 14, 2010

(54) POLYPHASE SOURCE DETECTING CIRCUIT

(75) Inventors: Jin-Liang Xiong, Shenzhen (CN);
Yong-Xing You, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 351 days.

(21) Appl. No.: 11/957,498

(22) Filed: Dec. 17, 2007

(65) Prior Publication Data

US 2009/0102673 A1   Apr. 23, 2009

(30) Foreign Application Priority Data

Oct. 18, 2007   (CN) .................. 2007 1 0202136

(51) Int. Cl.
*G08B 21/00* (2006.01)
*G08B 23/00* (2006.01)
*H02H 3/08* (2006.01)
*G01R 31/14* (2006.01)
*G06F 1/00* (2006.01)

(52) U.S. Cl. .............. 340/658; 340/657; 340/635; 340/529; 361/93.1; 324/509; 713/340

(58) Field of Classification Search ............ 340/658, 340/657, 635, 529; 361/93.1; 324/509; 713/340
See application file for complete search history.

(56) References Cited

U.S. PATENT DOCUMENTS

| | | | | |
|---|---|---|---|---|
| 4,417,240 A | * | 11/1983 | Ahmed .................... | 345/82 |
| 2008/0082849 A1 | * | 4/2008 | Takahashi et al. ........ | 713/340 |
| 2008/0100468 A1 | * | 5/2008 | Xu ........................ | 340/691.1 |
| 2008/0157989 A1 | * | 7/2008 | Chen et al. .............. | 340/660 |
| 2008/0165020 A1 | * | 7/2008 | Chen et al. .............. | 340/648 |
| 2008/0180265 A1 | * | 7/2008 | Chen et al. .............. | 340/641 |
| 2008/0258927 A1 | * | 10/2008 | Chen et al. .............. | 340/661 |
| 2009/0009038 A1 | * | 1/2009 | Hou ....................... | 310/68 B |
| 2009/0051555 A1 | * | 2/2009 | Chen et al. .............. | 340/635 |
| 2009/0066264 A1 | * | 3/2009 | Huang et al. ............. | 315/294 |

* cited by examiner

*Primary Examiner*—George A Bugg
*Assistant Examiner*—Jack Wang
(74) *Attorney, Agent, or Firm*—Frank R. Niranjan

(57) ABSTRACT

A polyphase source detecting circuit configured for detecting a polyphase source having at least two phase sources includes at least two sampling circuit and an alarm circuit. Each sampling circuit has a control switch. A control terminal of the control switch of each sampling circuit is connected to one of the phase sources of the polyphase source respectively. The alarm circuit has a first transistor, a first LED, and a second LED. The anodes of the first and second LEDs are connected to a power supply. The cathode of the first LED is connected to the gate of the first transistor and connected to ground via the control switches of the sampling circuits in turn. The cathode of the second LED is connected to the drain of the first transistor. The source of the first transistor grounded.

12 Claims, 1 Drawing Sheet

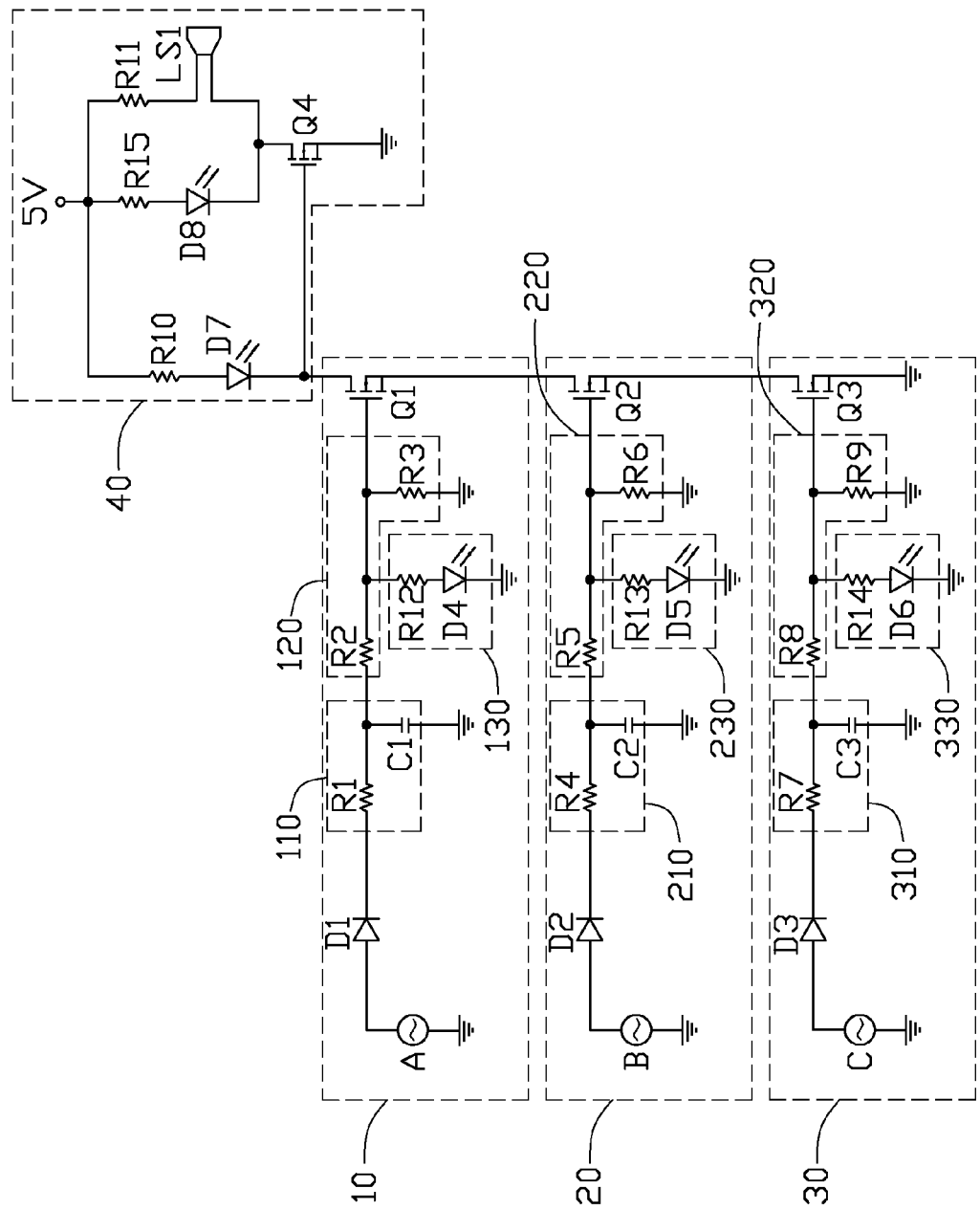

POLYPHASE SOURCE DETECTING CIRCUIT

BACKGROUND

1. Field of the Invention

The present invention relates to detecting circuits, and particularly to a polyphase source detecting circuit which can detect each phase source of a polyphase source.

2. Description of Related Art

Nowadays, polyphase sources such as a three-phase source are widely used in power supply systems of many electronic products. When a polyphase source used for an electronic product works, a detecting circuit needs to be used to detect work status of the polyphase source. However, if one phase source of the polyphase source does not work, the conventional detecting circuit cannot detect the abnormal phase source, the polyphase source will continue to work, thereby increasing the load to the remaining phase sources, which may damage the polyphase source.

What is needed is to provide a polyphase source detecting circuit which can detect each phase source of a polyphase source.

SUMMARY

An embodiment of a polyphase source detecting circuit configured for detecting a polyphase source having at least two phase sources includes at least two sampling circuits and an alarm circuit. Each sampling circuit has a control switch. A control terminal of the control switch of each sampling circuit is connected to one of the phase sources of the polyphase source respectively. The alarm circuit has a first transistor, a first LED, and a second LED. The anodes of the first and second LEDs are connected to a power supply. The cathode of the first LED is connected to the gate of the first transistor and connected to ground via the control switches of the sampling circuits in turn. The cathode of the second LED is connected to the drain of the first transistor. The source of the first transistor grounded.

Other advantages and novel features of the present invention will become more apparent from the following detailed description of an embodiment when taken in conjunction with the accompanying drawing, in which:

BRIEF DESCRIPTION OF THE DRAWING

The drawing is a circuit diagram of a polyphase source detecting circuit in accordance with an embodiment of the present invention.

DETAILED DESCRIPTION

Referring to the drawing, a polyphase source detecting circuit in accordance with an embodiment of the present invention includes a first sampling circuit 10, a second sampling circuit 20, a third sampling circuit 30, and an alarm circuit 40. In this embodiment, the polyphase source detecting circuit is configured for detecting a three-phase source. The first sampling circuit 10, the second sampling circuit 20, and the third sampling circuit 30 are configured to detect a first phase source A, a second phase source B, and a third phase source C respectively. In other embodiments, other kinds of polyphase sources can be detected by increasing or reducing the number of corresponding sampling circuits.

The first sampling circuit 10 includes a diode D1, an integral circuit 110 having a resistor R1 and a capacitor C1, a bleeder circuit 120 having a resistor R2 and a resistor R3, an indicator circuit 130 having a resistor R12 and a green light-emitting diode (LED) D4, and a control switch such as an NMOS transistor Q1. The anode of the diode D1 is connected to the power output of the first phase source A. The cathode of the diode D1 is connected to the gate of the transistor Q1 via the resistors R1 and R2 in turn. One terminal of the capacitor C1 is connected to a node between the resistor R1 and the resistor R2. The other terminal of the capacitor C1 is grounded. The gate of the transistor Q1 is connected to the anode of the LED D4 via the resistor R12, and connected to ground via the resistor R3. The cathode of the LED D4 is grounded.

The second sampling circuit 20 includes a diode D2, an integral circuit 210 having a resistor R4 and a capacitor C2, a bleeder circuit 220 having a resistor R5 and a resistor R6, an indicator circuit 230 having a resistor R13 and a green light-emitting diode (LED) D5, and a control switch such as an NMOS transistor Q2. The anode of the diode D2 is connected to the power output of the second phase source B. The cathode of the diode D2 is connected to the gate of the transistor Q2 via the resistors R4 and R5 in turn. One terminal of the capacitor C2 is connected to a node between the resistor R4 and the resistor R5. The other terminal of the capacitor C2 is grounded. The gate of the transistor Q2 is connected to the anode of the LED D5 via the resistor R13, and connected to ground via the resistor R6. The cathode of the LED D5 is grounded.

The third sampling circuit 30 includes a diode D3, an integral circuit 310 having a resistor R7 and a capacitor C3, a bleeder circuit 320 having a resistor R8 and a resistor R9, an indicator circuit 330 having a resistor R14 and a green light-emitting diode (LED) D6, and a control switch such as an NMOS transistor Q3. The anode of the diode D3 is connected to the power output of the third phase source C. The cathode of the diode D2 is connected to the gate of the transistor Q3 via the resistors R7 and R8 in turn. One terminal of the capacitor C3 is connected to a node between the resistor R7 and the resistor R8. The other terminal of the capacitor C3 is grounded. The gate of the transistor Q3 is connected to the anode of the LED D6 via the resistor R14, and connected to ground via the resistor R9. The cathode of the LED D6 is grounded.

The source of the transistor Q1 is connected to the drain of the transistor Q2. The source of the transistor Q2 is connected to the drain of the transistor Q3. The source of the transistor Q3 is grounded. The diodes D1, D2, and D3 are respectively configured to prevent power from the capacitors C1, C2, and C3 damaging the phase sources A, B, and C.

The alarm circuit 40 includes an NMOS transistor Q4, a green LED D7, a red LED D8, and a buzzer LS1. The drain of the transistor Q1 is connected to the cathode of the LED D7 and the gate of the transistor Q4. The anode of the LED D7 is connected to a 5V power supply. The source of the transistor Q4 is grounded. The drain of the transistor Q4 is connected to the cathode of the LED D8 and a terminal of the buzzer LS1. The anode of the LED D8 is connected to the 5V power supply via the resistor R15. The other terminal of the buzzer LS1 is connected to the 5V power supply via the resistor R11.

In use, if the three phase sources A, B, and C are all working normally, the LEDs D4, D5, and D6 are all turned on to respectively show the three phase sources A, B, and C are good. At the same time, the transistors Q1, Q2, and Q3 are turned on, and then the LED D7 is turned on, the transistor Q4 is turned off, the LED D8 is turned off, and the buzzer LS1 is off all of which indicates the three-phase source is good.

If one of the three phase sources A, B, and C such as the first phase source A stops working, but the two phase sources B, and C are both working normally, the LED D4 is turned off to show the first phase sources A is bad and the LEDs D5 and D6 are on to respectively show the two phase sources B and C are good. At the same time, the transistor Q1 and the LED D7 are turned off and the transistor Q4 is turned on. Thereby, the LED D8 is turned on and the buzzer LS1 works to indicate the three-phase source is bad.

In other embodiments, the colors of the LEDs D4, D5, D6, D7, and D8 can be changed according to need. The polyphase source detecting circuit can accurately detect each phase source of a polyphase source.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A polyphase source detecting circuit configured to detecting a polyphase source having at least two phase sources, comprising:
    at least two sampling circuits each having a control switch, a control terminal of the control switch of each of the at least two sampling circuits connected to one of the at least two phase sources of the polyphase source; and
    an alarm circuit having a first transistor, a first light-emitting diode (LED), and a second LED, the anodes of the first and second LEDs connected to a power supply, the cathode of the first LED connected to the gate of the first transistor and connected to ground via the control switches of the at least two sampling circuits in turn, the cathode of the second LED connected to the drain of the first transistor, the source of the first transistor grounded, if one of the at least two phase sources is abnormally, the corresponding control switch is turned off, thereby the first LED is turned off and the first transistor is turned on, and then the second LED is turned on.

2. The polyphase source detecting circuit as claimed in claim 1, wherein the alarm circuit further comprises a buzzer connected between the drain of the first transistor and the power supply.

3. The polyphase source detecting circuit as claimed in claim 1, wherein the first LED is green, the second LED is red.

4. The polyphase source detecting circuit as claimed in claim 1, wherein the first transistor is an NMOS transistor.

5. The polyphase source detecting circuit as claimed in claim 1, wherein each of the at least two sampling circuit further comprises a diode, an integral circuit having a first resistor and a first capacitor, a bleeder circuit having a second resistor and a third resistor, and an indicator circuit having a fourth resistor and a third LED, the corresponding control switch is an NMOS transistor, the anode of the diode is connected to the corresponding phase source, the cathode of the diode is connected to the gate of the corresponding control switch via the first and second resistors in turn, one terminal of the first capacitor is connected to a node between the first and second resistors, the other terminal of the first capacitor is grounded, the gate of the corresponding control switch is connected to the anode of the third LED via the second resistor, and connected to ground via the third resistor, the cathode of the third LED is grounded.

6. The polyphase source detecting circuit as claimed in claim 5, wherein the third LED is green.

7. A polyphase source detecting circuit configured to detecting a polyphase source having at least two phase sources, comprising:
    at least two sampling circuits each having a first NMOS transistor, the gate of the first NMOS transistor of each of the at least two sampling circuits connected to one of the at least two phase sources of the polyphase source; and
    an alarm circuit having a first light-emitting diode (LED), the anode of the first LED connected to a power supply, the cathode of the first LED connected to ground via the first NMOS transistors of the at least two sampling circuits in turn, if one of the at least two phase sources is abnormally, the corresponding first NMOS transistor is turned off, thereby the first LED is turned off.

8. The polyphase source detecting circuit as claimed in claim 7, wherein the alarm circuit further a second LED and a second NMOS transistor, the anode of the second LED connected to the power supply, the cathode of the second LED connected to the drain of the second NMOS transistor, the source of the second NMOS transistor grounded.

9. The polyphase source detecting circuit as claimed in claim 8, wherein the alarm circuit further comprises a buzzer connected between the drain of the second NMOS transistor and the power supply.

10. The polyphase source detecting circuit as claimed in claim 8, wherein the first LED is green, the second LED is red.

11. The polyphase source detecting circuit as claimed in claim 7, wherein each of the at least two sampling circuit further comprises a diode, an integral circuit having a first resistor and a first capacitor, a bleeder circuit having a second resistor and a third resistor, and an indicator circuit having a fourth resistor and a third LED, the anode of the diode is connected to the corresponding phase source, the cathode of the diode is connected to the gate of the corresponding first NMOS transistor via the first and second resistors in turn, one terminal of the first capacitor is connected to a node between the first and second resistors, the other terminal of the first capacitor is grounded, the gate of the corresponding first NMOS transistor is connected to the anode of the third LED via the second resistor, and connected to ground via the third resistor, the cathode of the third LED is grounded.

12. The polyphase source detecting circuit as claimed in claim 11, wherein the third LED is green.

* * * * *